United States Patent
Jung

(10) Patent No.: US 7,550,397 B2
(45) Date of Patent: Jun. 23, 2009

(54) METHOD OF MANUFACTURING A SEMICONDUCTOR DEVICE HAVING A PRE-METAL DIELECTRIC LINER

(75) Inventor: Sung Kyung Jung, Incheon (KR)

(73) Assignee: Dongbu HiTek Co., Ltd., Seoul (KR)

( * ) Notice: Subject to any disclaimer, the term of this patent is extended or adjusted under 35 U.S.C. 154(b) by 161 days.

(21) Appl. No.: 11/616,808

(22) Filed: Dec. 27, 2006

(65) Prior Publication Data
US 2007/0148959 A1   Jun. 28, 2007

(30) Foreign Application Priority Data
Dec. 28, 2005   (KR) .................. 10-2005-0131525

(51) Int. Cl.
*H01L 21/31* (2006.01)
(52) U.S. Cl. .................. 438/763; 438/435; 438/792; 257/632; 257/E21.576; 257/E21.493; 257/E29.015
(58) Field of Classification Search .................. 438/435, 438/792; 257/632, E21.576, E21.493, E29.015
See application file for complete search history.

(56) References Cited

U.S. PATENT DOCUMENTS 6,287,951 B1 * 9/2001 Lucas et al. .................. 438/618
7,091,088 B1 * 8/2006 Cheng et al. .................. 438/257

* cited by examiner

Primary Examiner—Caridad M Everhart
(74) Attorney, Agent, or Firm—Sherr & Vaughn, PLLC

(57) ABSTRACT

Embodiments relate to a semiconductor device and a method of manufacturing a semiconductor device having a pre-metal dielectric liner. In embodiments, method for forming a semiconductor device may include forming a pre-metal dielectric liner, which has a multi-layer structure including a plurality of interfacial surfaces, on an entire surface of a semiconductor substrate formed with a transistor, and forming a boron phospho silicate glass (BPSG) oxide layer on the pre-metal dielectric liner. Since the pre-metal dielectric liner is formed in a multi-layer structure having a plurality of interfacial surfaces, boron (B) of an upper BPSG oxide layer is not penetrated into the semiconductor substrate.

13 Claims, 3 Drawing Sheets

METHOD OF MANUFACTURING A SEMICONDUCTOR DEVICE HAVING A PRE-METAL DIELECTRIC LINER

The present application claims priority under 35 U.S.C. 119 and 35 U.S.C. 365 to Korean Patent Application No. 10-2005-0131525 (filed on Dec. 28, 2005), which is hereby incorporated by reference in its entirety.

BACKGROUND

A semiconductor device, such as a complementary metal oxide semiconductor (CMOS) transistor, may have an n channel type MOS transistor and a p channel type MOS transistor integrated on a single substrate. When forming such a semiconductor device, an insulating layer, which may include boron phospho silicate glass (BPSG) oxide having superior fluidity, may be formed to fill a space formed in a gate pattern after forming the gate pattern and silicide. Moreover, a pre-metal dielectric liner (PMD) may be formed before depositing the boron phospho silicate glass oxide layer. This may prevent boron (B) of the boron phospho silicate glass oxide layer from penetrating the substrate through a subsequent thermal process.

FIG. 1 is an example diagram illustrating a semiconductor device having a pre-metal dielectric liner (PMD).

Referring to FIG. 1, an active area of semiconductor substrate 100 having first area A and second area B may be defined by isolation layer 102. An n channel type MOS transistor may be arranged in first area A of semiconductor substrate 100, and a p channel type MOS transistor may be arranged in second area B of semiconductor substrate 100. Nitride layer 110, which may be a pre-metal dielectric liner, may be deposited on a surface (for example, the entire surface) of a resultant substrate. Boron phospho silicate glass oxide layer 120 may be deposited on nitride layer 110.

Nitride layer 110, which may be pre-metal dielectric liner 110, may be used as an etch stop layer when a subsequent etching process for a contact may be performed. In addition, pre-metal dielectric liner 110 may prevent the penetration of boron (B) of boron phospho silicate glass oxide layer 120 into semiconductor substrate 100 during a subsequent thermal process. If impurities such as boron (B) penetrate semiconductor substrate 100, a threshold voltage of a semiconductor device may be locally changed. This may tend to degrade the stability of a resulting device. In the related art, efforts to prevent boron (B) from penetrating the semiconductor substrate include using a gas atmosphere that may be controlled when forming nitride layer 110 as the pre-metal dielectric layer. This may cause a nitride-hydrogen (N—H) coupling force to be enhanced. However, according to the related art method, it may be difficult to prevent boron (B) from penetrating semiconductor substrate 100, and a thickness of nitride layer 110 may be required to be relatively thick.

SUMMARY

Embodiments relate to a method for manufacturing a semiconductor device. Embodiments relate to a method for manufacturing a semiconductor device having a pre-metal dielectric (PMD) liner.

Embodiments relate to a method for manufacturing a semiconductor device having a pre-metal dielectric liner that may be capable of improving the reliability of a semiconductor device by preventing boron of a boron phospho silicate glass oxide layer used as an insulating layer from penetrating into a semiconductor substrate.

In embodiments, a method for forming a semiconductor device may include forming a pre-metal dielectric liner, which has a multi-layer structure including a plurality of interfacial surfaces, on an entire surface of a semiconductor substrate formed with a transistor, and forming a boron phospho silicate glass (BPSG) oxide layer on the pre-metal dielectric liner.

In embodiments, the pre-metal dielectric layer may include a nitride layer. Embodiments, forming the pre-metal dielectric liner having the multi-layer structure may include a step of depositing the pre-metal dielectric liner in a unit thickness, several times.

In embodiments, a transistor formed on the semiconductor substrate may include a complementary metal oxide semiconductor (CMOS) transistor on which an n channel type metal oxide semiconductor (MOS) transistor and a p channel type metal oxide semiconductor (MOS) transistor are integrated.

DETAILED DESCRIPTION OF EMBODIMENTS

Figure 1:
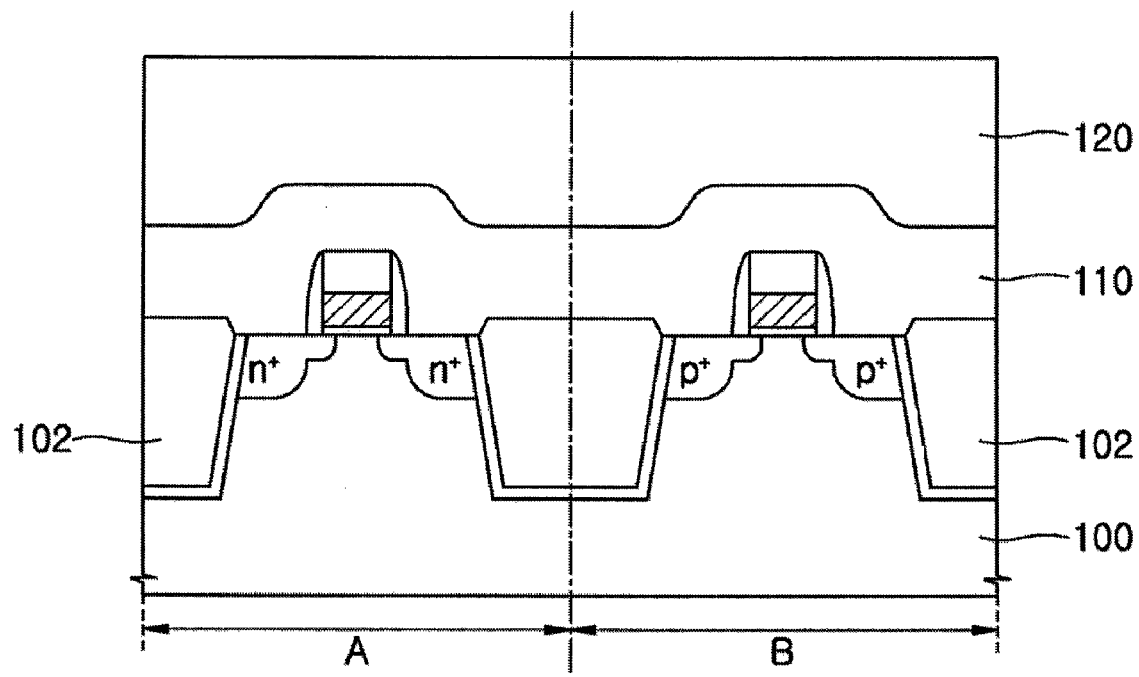
FIG. 1 is an example sectional view illustrating a related art semiconductor device having a pre-metal dielectric liner.
Figure 2:
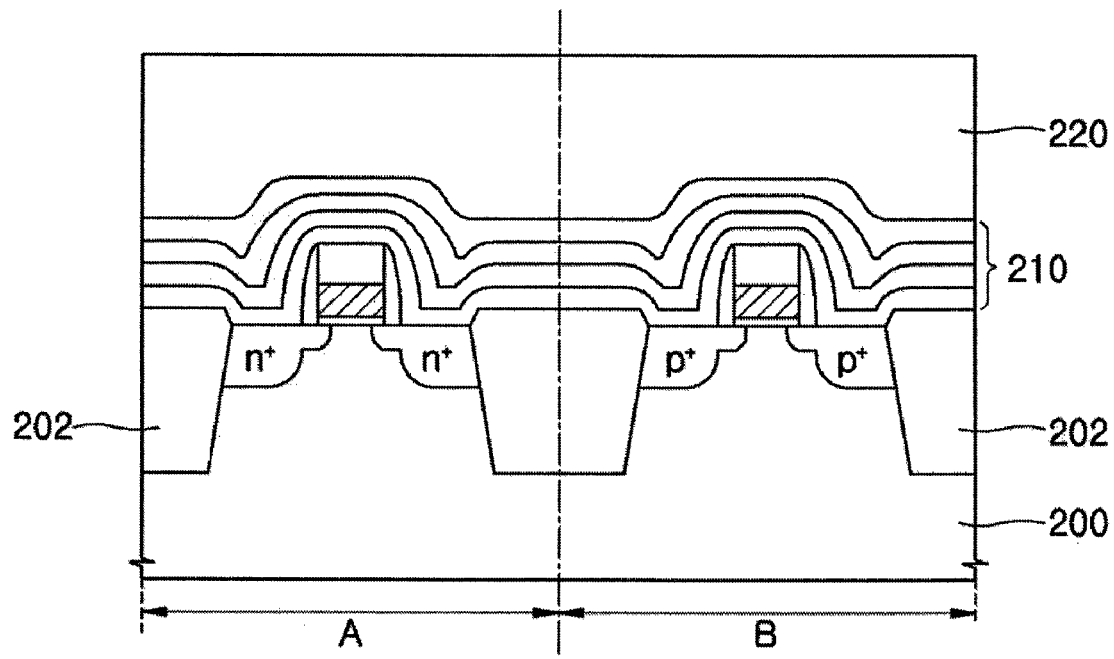
FIG. 2 is an example sectional view illustrating a method for manufacturing a semiconductor device having a pre-metal dielectric liner according to embodiments.

Referring to FIG. 2, isolation layer 202 may be formed on semiconductor substrate 200 having first area A and second area B, and may define an active area. Although in embodiments isolation layer 202 may be a trench isolation layer, in embodiments isolation layer 202 may not be limited to the trench isolation layer.

An n channel type MOS transistor and a p channel type MOS transistor may be formed on first area A and second area B of semiconductor substrate 200, respectively. This may form a complementary metal oxide semiconductor (CMOS) transistor. Although in embodiments a complementary metal oxide semiconductor (CMOS) transistor may be formed on semiconductor substrate 200, in embodiments an active device may be integrated with a passive device on semiconductor substrate 200. In addition, in embodiments one of the active device and the passive device may be integrated on semiconductor substrate 200.

An n+ type source/drain area may be positioned at first area A of semiconductor substrate 200 formed with the n channel type MOS transistor. A gate insulating layer may be interposed on a channel area between the source area and the drain area, and may form a gate conductive layer. A metal silicide layer may be formed on the gate conductive layer. A gate spacer layer may be formed at sides of the gate conductive layer and the metal silicide layer. Although it is not shown in drawings, in embodiments the metal silicide layer may be formed even on the upper part of the source/drain area.

A p+ type source/drain area may be formed in the second area of semiconductor substrate 200 formed with the p channel type MOS transistor. A gate insulating layer may be interposed on a channel area between the source area and the drain area, and may form a gate conductive layer. A metal silicide layer may be formed on the gate conductive layer. A gate spacer layer may be formed at both sides of the gate conductive layer and the metal silicide layer. Although not illustrated in drawings, in embodiments the metal silicide layer may be formed on the upper part of the source/drain area.

After forming the n channel type MOS transistor and the p channel type MOS transistor at first area A and second area B of semiconductor substrate 200, respectively, nitride layer 210 may be formed on a surface (for example, the entire surface) of the resultant structure. Nitride layer 210 may be a pre-metal dielectric layer and may have a multi-layer structure including a plurality of interfacial surfaces.

In embodiments, nitride layer 210 may not be prepared in the form of a single layer having a prescribed thickness, but may be prepared in the form of a multi-layer structure, for example by performing deposition several times with a relatively small (i.e. thin) thickness. If nitride layer 210 is formed as a multi-layer structure, a plurality of interfacial surfaces may exist in nitride layer 210, according to embodiments. In addition, energy may be unstably maintained at the interfacial surfaces. Accordingly, in embodiments, the interfacial surfaces may have a characteristic of bringing impurities or ions to change the unstable state in a stable state, so that the interfacial surfaces may serve as a trap.

Therefore, although nitride layer 210 may have a relatively small thickness as compared with that of the related art nitride layer, it may be possible to effectively prevent boron from penetrating the semiconductor substrate. After forming nitride layer 210 having a multi-layer structure, a boron phospho silicate glass (BPSG) oxide layer 220 may be formed on nitride layer 210.

Figure 3:
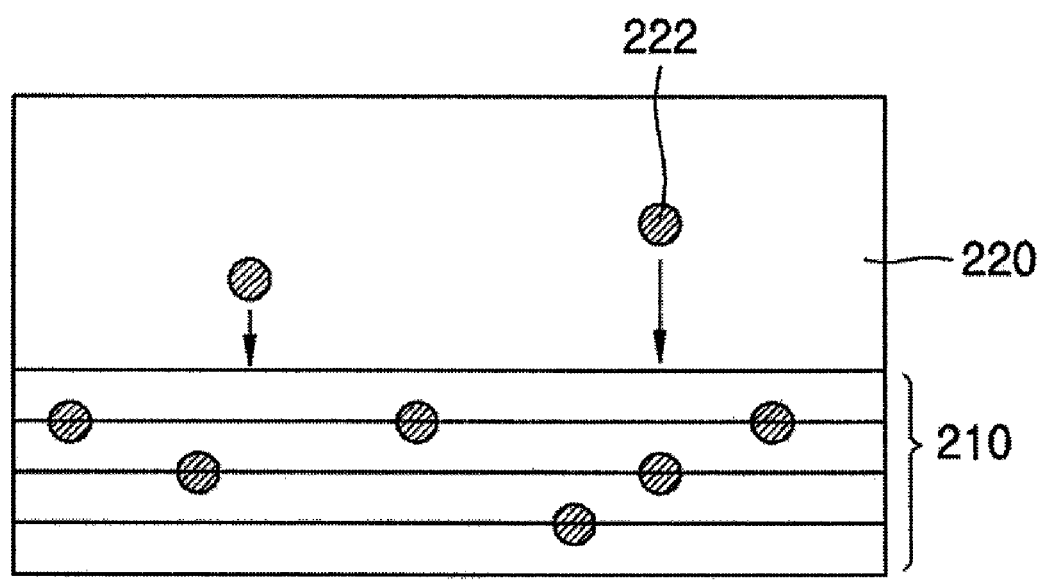
FIG. 3 is an example view illustrating restriction of boron penetration into a semiconductor substrate in a semiconductor device having a pre-metal dielectric liner formed according to embodiments.

FIG. 3 is an example diagram illustrating restriction of boron penetration into a semiconductor substrate in a semiconductor device having a pre-metal dielectric liner formed according to embodiments.

Referring to FIG. 3, as nitride layer 210, which may be a pre-metal dielectric (PMD) layer, may be formed in multi-layer structure, a plurality of interfacial surfaces having an unstable state exist. In this state, boron (B) ions 222 of upper BPSG oxide layer 220 may be staged to penetrate the semiconductor substrate through a subsequent heat treatment. In embodiments, the interfacial surfaces of nitride layer 210 may trap boron (B) ions 222 that would otherwise penetrate semiconductor substrate 200. This may shift an unstable state into a stable state. Accordingly, boron (B) ions 222 that may have been staged to penetrate semiconductor substrate 200 may be trapped in the interfacial surfaces of nitride layer 210. Accordingly, in embodiments boron (B) ions 222 may not penetrate semiconductor substrate 200.

According to embodiments, in a method for manufacturing a semiconductor device having a pre-metal dielectric liner, since the pre-metal dielectric liner may be formed in a multi-layer structure having a plurality of interfacial surfaces, boron (B) of an upper BPSG oxide layer may be trapped in the interfacial surfaces having an unstable state and may not penetrate the semiconductor substrate. As a result, it may be possible to improve the reliability of the semiconductor device.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method, comprising:
   forming a multi-layer pre-metal dielectric liner having a multi-layer structure including a plurality of interfacial surfaces, over a semiconductor substrate, wherein the multi-layer pre-metal dielectric liner comprises at least 4 nitride layers; and
   forming a boron phospho silicate glass (BPSG) oxide layer over the pre-metal dielectric liner.

2. The method of claim 1, wherein the multi-layer pre-metal dielectric liner is formed over an entire surface of the semiconductor substrate.

3. The method of claim 1, wherein the multi-layer pre-metal dielectric liner is configured to trap boron ions from the boron phospho silicate glass (BPSG) oxide layer in the interfacial surfaces.

4. The method of claim 1, wherein forming the multi-layer pre-metal dielectric liner comprises:
   depositing a first pre-metal dielectric liner having a unit thickness over the semiconductor substrate; and
   depositing a prescribed number of second pre-metal dielectric liners having the unit thickness over the first pre-metal dielectric liner.

5. The method of claim 1, further comprising forming at least one transistor on the semiconductor substrate.

6. The method of claim 5, wherein the at least one transistor formed on the semiconductor substrate comprises a complementary metal oxide semiconductor (CMOS) transistor on which an n channel type metal oxide semiconductor (MOS) transistor and a p channel type metal oxide semiconductor (MOS) transistor are integrated.

7. The method of claim 5, wherein the multi-layer pre-metal dielectric liner is formed over the at least one transistor.

8. A device, comprising:
   a semiconductor substrate;
   a multi-layer pre-metal dielectric liner, including a plurality of interfacial surfaces, over the semiconductor substrate, wherein the multi-layer pre-metal dielectric liner comprises at least 4 nitride layers; and
   a boron phospho silicate glass (BPSG) oxide layer over the multi-layer pre-metal dielectric liner.

9. The device of claim 8, wherein the multi-layer pre-metal dielectric liner is configured to trap boron ions from the boron phospho silicate glass (BPSG) oxide layer in the interfacial surfaces.

10. The device of claim 8, wherein the multi-layer pre-metal dielectric liner is formed over an entire surface of the semiconductor substrate.

11. The device of claim 8, further comprising at least one transistor formed on the semiconductor substrate.

12. The device of claim 11, wherein the at least one transistor formed on the semiconductor substrate comprises a complementary metal oxide semiconductor (CMOS) transistor on which an n channel type metal oxide semiconductor (MOS) transistor and a p channel type metal oxide semiconductor (MOS) transistor are integrated.

13. The device of claim 11, wherein the multi-layer pre-metal dielectric liner is formed over the at least one transistor.

* * * * *